(12) United States Patent
Takasone et al.

(10) Patent No.: US 10,442,987 B2
(45) Date of Patent: Oct. 15, 2019

(54) FLUORESCENT MEMBER, OPTICAL COMPONENT, AND LIGHT EMITTING DEVICE

(71) Applicant: NICHIA CORPORATION, Anan-shi, Tokushima (JP)

(72) Inventors: Toru Takasone, Tokushima (JP); Masahiko Sano, Anan (JP); Hiroyuki Inoue, Itano-gun (JP); Shoichi Yamada, Anan (JP); Takafumi Sugiyama, Yoshinogawa (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/118,209

(22) Filed: Aug. 30, 2018

(65) Prior Publication Data

US 2019/0062627 A1 Feb. 28, 2019

(30) Foreign Application Priority Data

Aug. 31, 2017 (JP) .................................. 2017-166519
May 31, 2018 (JP) .................................. 2018-104451

(51) Int. Cl.
*C09K 11/02* (2006.01)
*F21V 29/502* (2015.01)
(Continued)

(52) U.S. Cl.
CPC ............ *C09K 11/02* (2013.01); *C04B 35/115* (2013.01); *C04B 35/117* (2013.01); *C04B 38/0061* (2013.01); *C04B 38/0074* (2013.01); *C09D 5/22* (2013.01); *C09K 11/7706* (2013.01); *F21V 7/30* (2018.02); *F21V 9/30* (2018.02); *F21V 13/08* (2013.01); *F21V 29/502* (2015.01); *H01L 33/507* (2013.01); *C04B 35/64* (2013.01); *C04B 38/0041* (2013.01); *C04B 38/0054* (2013.01); *C04B 2111/807* (2013.01); *C04B 2235/3222* (2013.01); *C04B 2235/3225* (2013.01); *C04B 2235/5436* (2013.01); *C04B 2235/5445* (2013.01); *C04B 2235/6567* (2013.01); *C04B 2235/666* (2013.01); *C04B 2235/764* (2013.01); *C04B 2235/77* (2013.01);
(Continued)

(58) Field of Classification Search
CPC ..... C09K 11/02; C04B 35/117; C04B 35/115; C09D 5/22; F21V 9/30
See application file for complete search history.

(56) References Cited

U.S. PATENT DOCUMENTS

2013/0257264 A1  10/2013  Tamaki et al.
2015/0159836 A1   6/2015  Tamaki et al.
(Continued)

FOREIGN PATENT DOCUMENTS

JP    2003-243727 A    8/2003
JP    2010-280523 A   12/2010
(Continued)

*Primary Examiner* — Joseph L Williams
(74) *Attorney, Agent, or Firm* — Foley & Lardner LLP (57) ABSTRACT

A fluorescent member includes: a plurality of fluorescent particles; an inorganic binder; and a plurality of pores. An upper surface of the fluorescent member is a light extraction surface of the fluorescent member. The plurality of pores are localized in a vicinity of at least one of the plurality of fluorescent particles in a cross section that is parallel to the upper surface of the fluorescent member and extends through the fluorescent particles and the pores.

20 Claims, 5 Drawing Sheets

(51) Int. Cl.
  *C09K 11/77* (2006.01)
  *F21V 9/30* (2018.01)
  *F21V 13/08* (2006.01)
  *F21V 7/30* (2018.01)
  *C04B 35/115* (2006.01)
  *C04B 35/117* (2006.01)
  *C04B 38/00* (2006.01)
  *C09D 5/22* (2006.01)
  *H01L 33/50* (2010.01)
  *C04B 35/64* (2006.01)
  *H01L 33/64* (2010.01)
  *C04B 111/80* (2006.01)

(52) U.S. Cl.
  CPC ............ *C04B 2235/786* (2013.01); *C04B 2235/9653* (2013.01); *H01L 33/644* (2013.01); *H01L 2933/0041* (2013.01)

(56) References Cited

U.S. PATENT DOCUMENTS

| | | |
|---|---|---|
| 2015/0210919 A1 | 7/2015 | Won et al. |
| 2015/0219291 A1 | 8/2015 | Yamaguchi |
| 2016/0084476 A1 | 3/2016 | Koole et al. |
| 2017/0160627 A1 | 6/2017 | Ikesue et al. |

FOREIGN PATENT DOCUMENTS

| | | |
|---|---|---|
| JP | 2012-104267 A | 5/2012 |
| JP | 2013-203822 A | 10/2013 |
| JP | 2015-001709 A | 1/2015 |
| JP | 2015-149394 A | 8/2015 |
| WO | WO-2014-147570 A1 | 9/2014 |
| WO | WO-2017/064951 A1 | 4/2017 |
| WO | WO-2017/098730 | 6/2017 |
| WO | WO-2017/098963 | 6/2017 |
| WO | WO-2018-155671 A1 | 8/2018 |

FLUORESCENT MEMBER, OPTICAL COMPONENT, AND LIGHT EMITTING DEVICE

CROSS-REFERENCE TO RELATED APPLICATIONS

This application claims priority to Japanese Patent Application No. 2017-166519, filed on Aug. 31, 2017 and Japanese Patent Application No. 2018-104451, filed on May 31, 2018, the disclosures of which are hereby incorporated by reference in their entireties.

BACKGROUND

The present disclosure relates to a fluorescent member, an optical component including the fluorescent member, and a light emitting device including the fluorescent member.

A wavelength conversion member disclosed in WO 2017/064951 A is made of a sintered product containing a fluorescent material and a ceramic binder.

SUMMARY

Such conventional wavelength conversion member still has room for improvement, such as achieving both high levels of luminance and mechanical strength.

A fluorescent member according to the present disclosure includes a plurality of fluorescent particles, an inorganic binder, and a plurality of pores. The upper surface of the fluorescent member is a light extraction surface of the fluorescent member. The plurality of pores are localized in a vicinity of at least one of the plurality of fluorescent particles in a cross section that is parallel to the upper surface and extends through the fluorescent particles and the pores.

According to the fluorescent member described above, the fluorescent member can enhance its luminance while maintaining a certain mechanical strength.

DETAILED DESCRIPTION

Certain embodiments of the present disclosure will be described below with reference to the accompanying drawings. The following embodiments are illustrative only to exemplify the technical idea of the present invention and are not construed to limit the present invention. Furthermore, the size, positional relationship, and the like of members shown in each drawings are emphasized to clarify the description. The same names and reference characters denote the same or similar members in principle, and thus a duplicate description thereof will be omitted as appropriate.

First Embodiment

Figure 1:
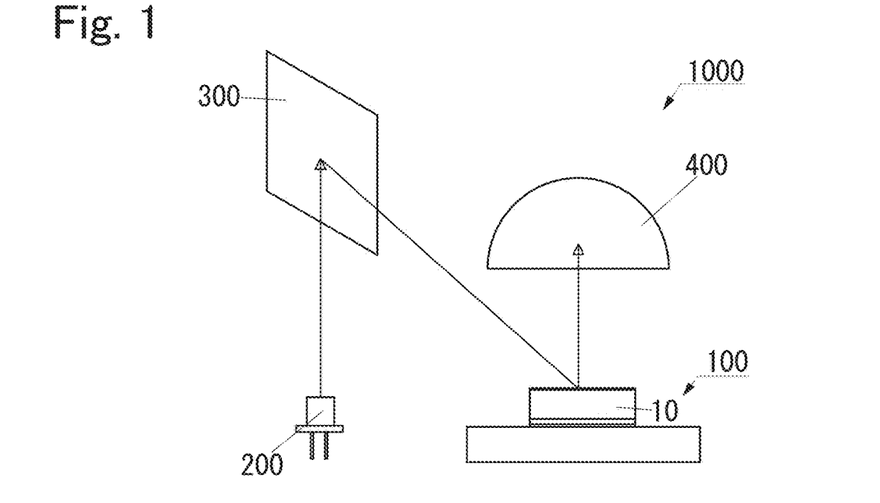
FIG. 1 is a schematic diagram of a light emitting device according to the first embodiment.
Figure 2:
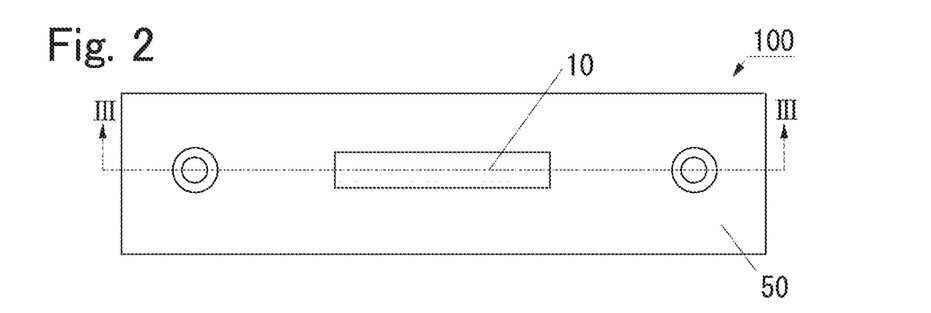
FIG. 2 is a top view of an optical component.
Figure 3:
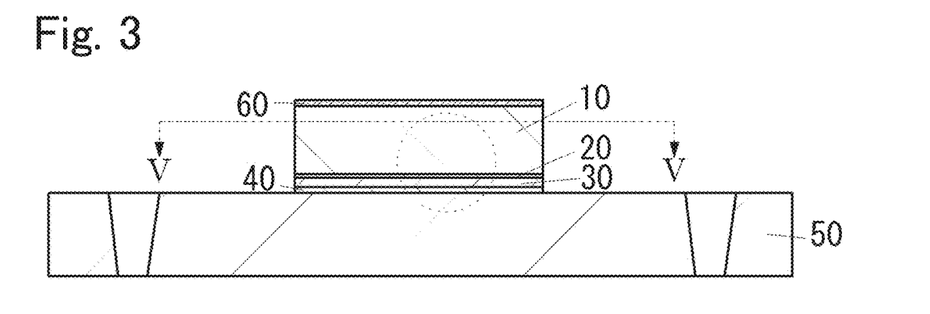
FIG. 3 is a cross-sectional view taken along the line III-III in FIG. 2.
Figure 4:
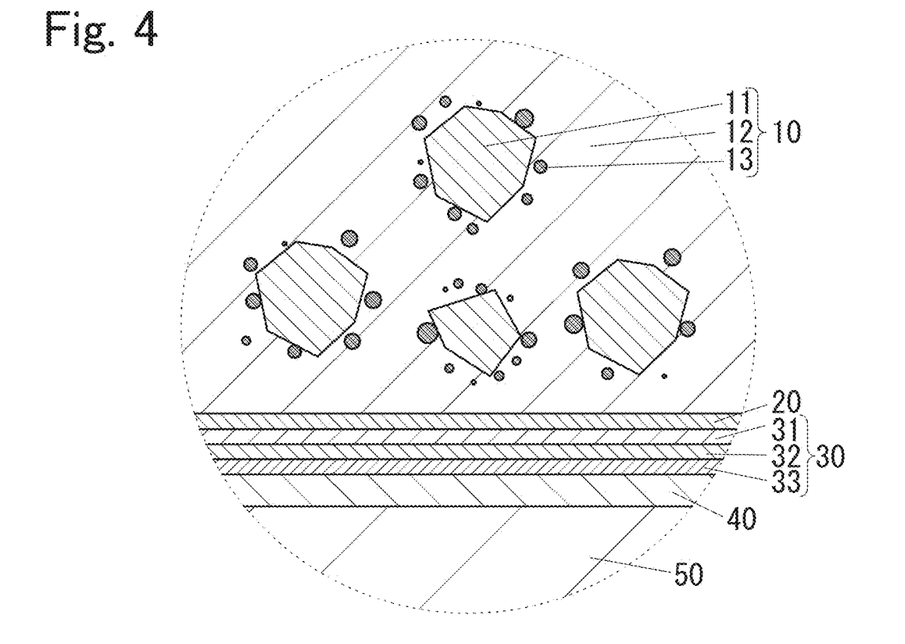
FIG. 4 is a cross-sectional view within the dotted lines in FIG. 3.

FIG. 1 shows a schematic diagram of a light emitting device 1000 according to the present embodiment. FIG. 2 shows a top view of an optical component 100, and FIG. 3 shows a cross-sectional view taken along the line III-III in FIG. 2. FIG. 4 shows an enlarged view of a part within the dotted lines in FIG. 3; and FIG. 5 shows an enlarged view of a part of the cross-sectional view taken along the line V-V in FIG. 3.

As shown in FIG. 1, the light emitting device 1000 includes: the optical component 100 including a fluorescent member 10; a light source 200 for emitting excitation light to be irradiated on the fluorescent member; a mirror 300 for reflecting the excitation light from the light source 200 toward the fluorescent member 10; and a lens 400 that forms an image so the light from the fluorescent member 10 becomes a parallel beam.

Figure 5:
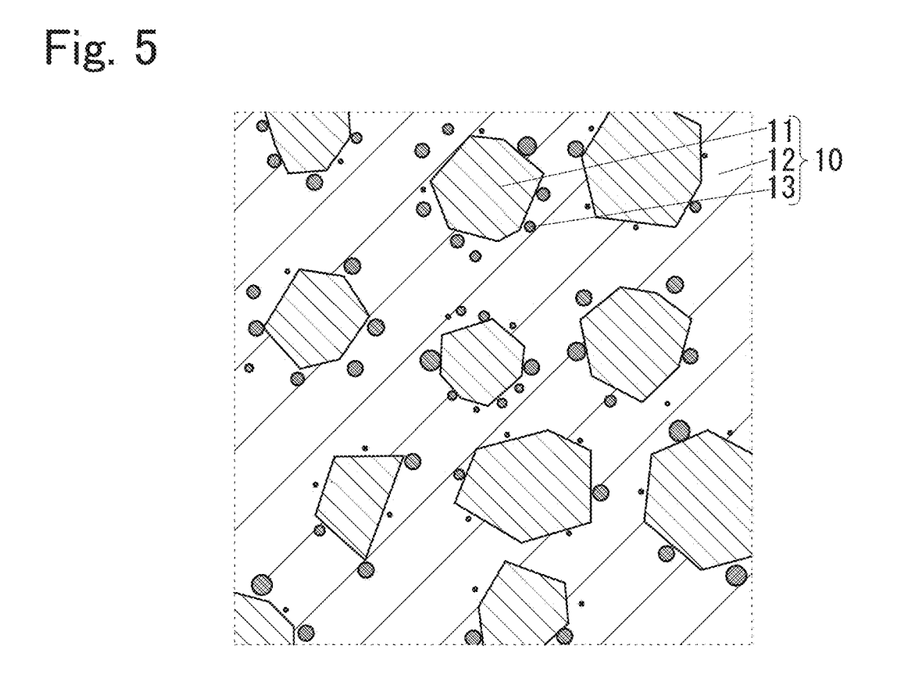
FIG. 5 is an enlarged view of a part of the cross-sectional view taken along the line V-V in FIG. 3.

As shown in FIGS. 2 to 5, the fluorescent member 10 includes a plurality of fluorescent particles 11 and an inorganic binder 12, and has an upper surface thereof serving as a light extraction surface. As shown in FIG. 5, the fluorescent member 10 contains a plurality of pores 13. The plurality of pores 13 are localized in a vicinity of the at least one of the plurality of fluorescent particles 11 in a cross section that is parallel to the upper surface of the fluorescent member and extends through the fluorescent particles 11 and the pores 13.

The fluorescent member 10 described above can reduce the spread of the light from the fluorescent particles 11 in the lateral direction (in the right-left direction of FIG. 3) and simultaneously can also secure the mechanical strength of the fluorescent member. These points will be described below.

There is known a fluorescent member that includes fluorescent particles and an inorganic binder. With such fluorescent members, the light from the fluorescent particles propagates and spreads laterally within the inorganic binder. Thus, normally, the luminance of the light emitting device as observed from above is reduced to some extent. In light of this, it is possible to provide a plurality of pores within the fluorescent member to thereby increase regions with different refractive indexes in the fluorescent member. Thus, the light from the fluorescent particles can be easily scattered, thereby suppressing the unnecessary or lateral propagation of the light from the fluorescent particles. However, if the number of pores is increased within the fluorescent member in order to enhance the luminance, the strength of the fluorescent member will be reduced. In contrast, if the number of pores is decreased in order to secure the strength of the fluorescent member, unnecessary propagation of the light from the fluorescent particles is less likely to be reduced within the fluorescent member.

For this reason, in the present embodiment, the plurality of pores 13 are localized in the regions near the fluorescent particles 11. Thus, in the regions with fewer pores, located far from the fluorescent particles 11, the strength of the whole fluorescent member 10 is secured, while in the regions with more pores, located near the fluorescent particles 11, the unnecessary or lateral propagation of the light from the fluorescent particles 11 can be prevented. This can produce the fluorescent member 10 which enhances its luminance and simultaneously maintains a certain strength.

Components of the light emitting device 1000 will be described below.

(Optical Component 100)

As shown in FIGS. 2 and 3, the optical component 100 includes a base 50 and the fluorescent member 10 connected with an upper surface of the base 50. A reflective film 20 is provided on a lower surface of the fluorescent member 10. A diffusion preventive layer 30 is provided on a lower surface of the reflective film 20, and a lower surface of the diffusion preventive layer 30 and the upper surface of the base 50 are bonded together by a bonding member 40. The term "connect" or "connection" of certain members includes the state where the members are directly bonded together, as well as where the members are indirectly connected via other members.

(Fluorescent Member 10)

As shown in FIG. 3, the fluorescent member 10 has an upper surface serving as the light extraction surface, a lower surface positioned on the side opposite to the upper surface, and side surfaces connecting the upper surface and the lower surface. The fluorescent member 10 includes the plurality of fluorescent particles 11, the inorganic binder 12, and the plurality of pores 13. As shown in FIG. 5, the plurality of pores 13 are localized in the vicinity of the fluorescent particles 11 in one cross section (hereinafter referred to as a "cross section X") that is parallel to the upper surface of the fluorescent member 10 and extends through the fluorescent particles 11 and the pores 13. Thus, such pores 13 can suppress the unnecessary propagation of the light through the fluorescent member 10 to enhance the luminance of the light emitting device. Consequently, the fluorescent member 10 can have a high contrast ratio, compared to a fluorescent member with no pores. The contrast ratio can be recognized, for example, as a ratio of the maximum luminance of an emission intensity distribution on the upper surface of the fluorescent member 10 to the luminance at a position spaced apart by 1 mm from the position showing the maximum luminance. The term "localized in the vicinity of the fluorescent particles" as used in the above description refers to, for example, a state in which for at least one fluorescent particle 11, the density of the pores 13 located in a region sandwiched between a surface of the fluorescent particle 11 and a line spaced apart by 0.1 µm from the surface is higher than the density of the pores 13 located outside the aforementioned region. This is determined by observing a photograph of the cross section X of the fluorescent member, which has been taken on a scale that allows ten fluorescent particles 11 to be clearly observed with a scanning electron microscope (SEM). The term "parallel to the upper surface of the fluorescent member 10" as used herein includes not only a state of being completely parallel to the upper surface of the fluorescent member 10, but also a state of being inclined by ±10 degrees relative to the upper surface. In a case where the upper surface of the fluorescent member 10 is a rough surface as viewed microscopically, the cross section X is defined as a cross section parallel to the flat upper surface of the fluorescent member 10 as viewed macroscopically.

The plurality of pores 13 may be provided in the depth direction from the upper surface of the fluorescent member 10. That is, as shown in FIG. 4, a plurality of pores 13 may also be provided in one cross section (hereinafter referred to as a "longitudinal section Y") that is perpendicular to the upper surface of the fluorescent member 10 and extends through the fluorescent particles 11 and the pores 13. The pores 13 can also suppress the unnecessary propagation of the light entering the fluorescent member 10 from its upper surface toward the inside thereof. Because of this, preferably, a plurality of pores 13 is localized in the vicinity of the fluorescent particles 11 on a plurality of cross sections X, these cross sections X being spaced apart from each other by, for example, 10 µm or more.

The shape of the fluorescent member 10 can be a rectangular parallelepiped that is elongated in one direction or a cube in order to easily fabricate the fluorescent member 10. Particularly, the shape of the fluorescent member 10 is preferably a rectangular parallelepiped. When the fluorescent member 10 has a rectangular parallelepiped shape, the length in the right-left direction of the fluorescent member 10 as viewed from above (which is the width of the fluorescent member 10 and corresponds to the length thereof in the lateral direction as shown in FIG. 2) is preferably set in a range from 10 mm to 15 mm, and the length in the vertical direction of the fluorescent member 10 (which is the length of the fluorescent member 10 and corresponds to the length thereof in the longitudinal direction as shown in FIG. 2) is preferably set in a range from 2 mm to 5 mm. By setting each length of the fluorescent member 10 to the above-mentioned corresponding lower limit value or more, a region irradiated with the excitation light can be changed. By setting each length of the fluorescent member 10 to the above-mentioned upper limit value or less, the area of the fluorescent member 10 can be suppressed from becoming larger than necessary.

The thickness of the fluorescent member 10 (the length in the vertical direction thereof in FIG. 3) is preferably in a range from 50 µm to 200 µm, and more preferably in a range from 70 µm to 130 µm. The chromaticity of a mixed light of the excitation light and the fluorescence can be easily adjusted by setting the thickness of the fluorescent member 10 to the above-mentioned lower limit value or more. Meanwhile, a distance from the fluorescent particles 11 located on an upper surface side, which is more likely to generate heat, to the base 50 can be restricted to a small value by setting the thickness of the fluorescent member 10 to the above-mentioned upper limit value or less, so that the heat generated by the fluorescent member 10 can be easily dissipated into the base 50.

As shown in FIG. 1, the optical component 100 is preferably configured such that in the fluorescent member 10, the incident surface of the excitation light for exciting the fluorescent particles 11 coincides with the light extraction surface from which the fluorescence generated from the fluorescent particles 11 is extracted, and that the excitation light is incident on this surface from an oblique direction. In such an optical component 100, the excitation light is less likely to be extracted from above (directly above). Thus, the light extracted from above in a conventional fluorescent member tends to have more color of the fluorescence, and less color of the excitation light. For example, when the excitation light is blue and the fluorescence is yellow, a strong yellow light tends to be easily extracted. However, according to the fluorescent member 10, the pores 13 can scatter the excitation light, thereby increasing the intensity of the color of the excitation light in the mixed light finally obtained.

(Fluorescent Particles 11)

Examples of the material of the fluorescent particles 11 suitable for use include an yttrium aluminum garnet (YAG)-based phosphor, a nitrogen-containing calcium aluminosilicate ($CaO$—$Al_2O_3$—$SiO_2$) phosphor activated with europium and/or chromium, a silicate (($Sr,Ba$)$_2SiO_4$) phosphor activated with europium, an α sialon phosphor, and a β sialon phosphor. Among these, the YAG-based phosphor is preferably used. This is because the YAG-based phosphor can reduce deterioration of the fluorescent member due to excitation light because it is a material having relatively high heat resistance. Here, the YAG-based phosphors also include, for example, one in which Tb is substituted for at least part of Y sites, and one in which Lu is substituted for at least part of Y sites. The YAG-based phosphor may contain Gd, Ga, or the like in its composition.

The particle size of the fluorescent particle 11 is preferably, for example, in a range from 1 μm to 20 μm, and more preferably in a range from 3 μm to 6 μm. The pores 13 are easily provided by setting the particle size of the fluorescent particle 11 to the above-mentioned lower limit value or more, whereas the fluorescent particles 11 are less likely to be evenly distributed in the fluorescent member 10 by setting the particle size of the fluorescent particle 11 to the above-mentioned upper limit value or less. In a method of measuring a particle size of the fluorescent particle 11, for example, the particle size can be measured by determining an average of the shortest particle size and the longest particle size of the fluorescent particles 11 having a shape close to a circle on an SEM image taken on a scale that allows ten fluorescent particles 11 to be clearly observed with the SEM.

The content of the fluorescent particles 11 in the fluorescent member 10 is preferably in a range from 40% by mass to 70% by mass, and more preferably in a range from 45% by mass to 60% by mass. By setting the content of the fluorescent particles 11 to the above-mentioned lower limit value or more in terms of % by mass, the content of the inorganic binder 12 in terms of % by mass can be relatively lowered, so the pores 13 are easily formed. Thus, it is easier to suppress the unnecessary propagation of the light from the fluorescent particles 11. By setting the content of the fluorescent particles 11 to the above-mentioned upper limit value or less, the content of the inorganic binder 12 in terms of % by mass can be adequately secured. Thus, the reduction in the strength of the fluorescent member 10 is easily suppressed, and the heat generated from the fluorescent particles 11 is easily released. In particular, in the optical component 100, an incident surface on which excitation light for exciting the fluorescent particles 11 is incident and the light extraction surface for extracting the fluorescence from the fluorescent particles 11 are the same surface. In such an optical component 100, if the content of the fluorescent particles 11 in the fluorescent member 10 is lower in terms of % by mass, the light incident on the fluorescent member 10 does not collide with the fluorescent particles 11, but could be absorbed in the metal used in the reflective film 20. However, by securing a certain mass or more of the fluorescent particles 11 in the fluorescent member 10, the amount of the excitation light absorbed in the metal can be reduced.

(Inorganic Binder 12)

The inorganic binder 12 binds the fluorescent particles 11. The inorganic binder 12 is preferably made of any material that has a coefficient of thermal expansion close to a coefficient of thermal expansion of the fluorescent member 10. Examples of the inorganic binder 12 suitable for use include aluminum oxides, yttrium oxides, and the like.

(Pores 13)

The plurality of pores 13 is provided to be localized in the vicinity of the fluorescent particles 11. The pores 13 are made of vacuum, air, or the like.

As shown in FIG. 5, on the cross section X, a part of the plurality of pores 13 are preferably provided along the periphery of each fluorescent particle 11. Thus, the pores 13 can easily suppress the unnecessary propagation of the light from the fluorescent particles 11. The plurality of pores 13 is preferably provided over ½ or more of the entire periphery of the fluorescent particle 11, and further preferably ⅓ or more thereof, in the cross section X.

Preferably, the refractive index of the pores 13 is lower than the refractive index of the inorganic binder 12, whereas the refractive index of the inorganic binder 12 is lower than the refractive index of the fluorescent particle 11. Thus, the excitation light is more likely to totally reflect at an interface between the pores 13 and the inorganic binder 12, and at an interface between the inorganic binder 12 and the fluorescent particle 11, so that the excitation light can be extracted easily. At this time, some of the plurality of pores 13 are more preferably in direct contact with the fluorescent particles 11. A difference in the refractive index between the pores 13 and the fluorescent particle 11 is larger than a difference in the refractive index between the inorganic binder 12 and the fluorescent particle 11, thereby making it possible to easily suppress the unnecessary propagation of light from the fluorescent particles 11.

In the cross section X, the area of one pore 13 is preferably smaller than the area of one fluorescent particle 11. This is because the plurality of pores 13, each having a smaller area, can easily reflect the light from the fluorescent particles 11, while maintaining the strength of the fluorescent member 10. The term "the area of the pores 13 is smaller than the area of the fluorescent particles 11" refers to, for example, a state in which every pore 13 is observed to be smaller than every fluorescent particle 11 in a photograph of the cross section of the fluorescent member 10 on a scale that allows ten fluorescent particles 11 to be clearly observed with the SEM. The area of the pore 13 is, for example, in a range from 0.01 μm² to 2 μm².

(Reflective Film 20)

The reflective film 20 is provided on the lower surface of the fluorescent member 10. Thus, the light directed from the fluorescent member 10 to the lower surface can be reflected upward by the reflective film 20.

The reflective film 20 can include at least one of a metal film and a dielectric film. Each of the metal film and the dielectric film may be a single layer or multilayer. The metal film can be formed using, for example, Al or Ag. The dielectric film can be formed using, for example, a silicon oxide, a titanium oxide, an aluminum oxide, or a niobium oxide. In the case of using both the metal film and the dielectric film, the dielectric film and the metal film are provided in this order from the lower surface side of the fluorescent member 10.

(Diffusion Preventive Layer 30)

When the reflective film 20 includes a metal film, the diffusion preventive layer 30 is preferably provided on the lower surface of the reflective film 20. Thus, the diffusion preventive layer 30 suitable for use that can reduce the diffusion of the material of the bonding member 40 into the metal film can contain, for example, at least one of Ti, Pt, Au, Pd, and Ta.

(Bonding Member 40)

The bonding member 40 is for connecting the fluorescent member 10 and the base 50 together. A member containing, for example, AuSn, Ag, Al, Au, or the like as a main component, or a member formed of resin that contains a scattering material can be used as the bonding member 40. Among these, eutectic alloys, such as AuSn, are preferably used from the viewpoint of bonding strength.

(Base 50)

The base 50 is made of material having a higher thermal conductivity than the fluorescent member 10. The lower surface of the fluorescent member 10 is connected to the upper surface of the base 50. Because of this, the heat generated from the fluorescent member 10 can be easily released into the base 50, thereby reducing deterioration of the fluorescent particles 11. When the reflective film 20 and the base 50 are directly bonded together, the fluorescent member 10 is connected with the base 50 without interposing the bonding member 40 therebetween.

The base 50 includes at least one of a metal or a diffuse reflective ceramic. Examples of usable metals include Cu, CuMo, and CuW, and examples of usable light-diffusing ceramics include aluminum oxides and aluminum nitrides.

The thickness of the base 50 is preferably, for example, in a range from 1 mm to 3 mm. By setting the thickness of the base 50 to 1 mm or more, the optical component becomes easy to handle, while by setting the thickness of the base 50 to 3 mm or less, the optical component can be prevented from becoming too large.

(Protective Film 60)

A protective film 60 may be provided on the upper surface of the fluorescent member 10. The protective film 60 can be formed using, for example, a silicon oxide or a niobium oxide.

(Method for Manufacturing Optical Component 100)

The fluorescent member 10 included in the optical component can be fabricated, for example, by the following method.

The method for manufacturing the fluorescent member 10 includes steps of: mixing the fluorescent particles 11 and ceramic particles together; and sintering the ceramic particles to integrate the ceramic particles with the fluorescent particles 11 such that the pores 13 are localized in the vicinity of the fluorescent particles 11, thereby producing the fluorescent member 10 that contains the fluorescent particles 11, the inorganic binder 12, and the pores 13. Here, the method further includes the steps of: applying a heat treatment to the fluorescent member 10; slicing the fluorescent member 10; and polishing and grinding an upper surface of the fluorescent member 10. For simple explanation, the term "fluorescent member 10" as used herein includes not only a fluorescent member before slicing or singulating, but also a fluorescent member after the singulation. Each step included in the method for manufacturing the fluorescent member 10 will be described below.

First, the fluorescent particles 11 and the ceramic particles that later become the inorganic binder 12 are mixed together. At this time, ceramic particles that have a sintering temperature lower than the sintering temperature of the fluorescent particles 11 are used as the above-mentioned ceramic particles. Thus, the ceramic particles can be sintered while reducing the deterioration of the fluorescent particles 11 due to the heat. The particle size of the ceramic particle is preferably smaller than the particle size of the fluorescent particle 11. Consequently, the adhesion force of the ceramic particles with the fluorescent particles 11 tends to be high. The particle size of the ceramic particle is preferably, for example, in a range from $1/15$ to $1/2$ of the particle size of the fluorescent particle 11, and more preferably in a range from $1/12$ to $1/5$ thereof. For example, the particle size of the ceramic particle is preferably in a range from 0.1 µm to 2 µm, and more preferably in a range from 0.3 µm to 1 µm. By setting the particle size of the ceramic particle to the above-mentioned lower limit value or more, the fluorescent member 10 can be stably fabricated, while by setting the particle size of the ceramic particle to the above-mentioned upper limit value or less, the adhesion force of the ceramic particles with the fluorescent particles 11 can be adequately secured.

Then, the ceramic particles are sintered to be integrated with the fluorescent particles 11, thereby producing the fluorescent member 10 that contains the fluorescent particles 11 and the inorganic binder 12. The suitable sintering method is, for example, a discharge-plasma sintering (Spark Plasma Sintering, SPS) method or a hot press (HP) method. At this time, in order not to make the sintered density of the fluorescent member 10 extremely high, the sintering is performed by adjusting the sintering temperature and time.

When sintering the ceramic particles, the ceramic particles shrink while being bonded with other nearby ceramic particles. At this time, in a region far from the fluorescent particles 11, the ceramic particles are evenly distributed in the surroundings of the region, and hence are more likely to be bonded to each other. However, in a region in the vicinity of the fluorescent particles 11, the ceramic particles are less likely to be bonded to each other due to the presence of the fluorescent particles 11. Consequently, it is thought that the pores 13 tend to be localized in the vicinity of the fluorescent particles 11.

Here, the sintering temperature and time are those at which the surfaces of the ceramic particles can be sintered, but the fluorescent particles 11 cannot be sintered. For example, when the sintering is performed by the SPS method using a YAG-based phosphor as the material of the fluorescent particles 11 and an aluminum oxide as the material of the ceramic particles, the sintering temperature is preferably set in a range from 1200 degrees to 1500 degrees, and the sintering temperature is preferably held at the set temperature for a time within a range from one minute to twenty minutes.

The sintered density of the fluorescent member 10 is preferably in a range from 90% to 98%, and more preferably in a range from 93.5% to 96%. By setting the sintered density of the fluorescent member 10 to the above-mentioned lower limit value or more, the strength of the fluorescent member 10 is easily secured, while by setting the sintered density thereof to the above-mentioned upper limit value or less, a decrease in luminance of the light emitting device can be reduced, and the luminous flux can be increased, as compared with a fluorescent member having a relatively high sintered density. The reason that the luminous flux can be increased is thought to be that, as the light is less likely to reach to the side close to the lower surface of the fluorescent member 10 in the presence of the pores 13, the absorption of light in metal or the like included in the reflective film can be reduced. In this specification, sintered density refers to a measurement measured using Archimedes's law as described below. First, a weight A of the fluorescent member 10 is determined with a balance. Then, the fluorescent member 10 is put into the water in a container so as not to touch the bottom of the container. Subsequently, a weight B of the fluorescent member 10 in the water when buoyancy of the water is applied is determined. Then, the weight A is divided by the buoyancy applied to the fluorescent member 10 (A-B), in other words, the volume of the fluorescent member 10 (A-B), to determine the specific gravity C of the fluorescent member 10 including the pores 13. Meanwhile, the true specific gravity D of the fluorescent particles 11 and the ceramic particles included in the fluorescent member 10 is determined. Finally, the sintered density of the fluorescent member 10 can be determined by dividing C by D.

In general, because a sintering die used in the SPS method or a hot pressing (HP) method contains carbon, an oxide tends to be carburized to cause a reduction reaction during sintering, and hence light is absorbed in the carbon. Thus, in the present embodiment, the fluorescent member 10 obtained by the SPS method or the like is finally subjected to a heat treatment under an oxidizing atmosphere. As a result, carbon contained in the oxides can be removed to return oxygen, which has been lost, to the fluorescent member 10.

The heat treatment step is preferably at a temperature ranging from 1200 degrees to 1450 degrees and for a time ranging from one hour to 40 hours. By setting the temperature and time to the above-mentioned lower limit values or more, oxygen is more likely to be returned to the oxide contained in the inorganic binder 12, while by setting the temperature and time to the above-mentioned upper limit values or less, the deterioration of the fluorescent particles can be prevented.

The obtained fluorescent member 10 may be used as it is. However, if the obtained fluorescent member 10 is much thicker than the desired thickness of the fluorescent member 10, this fluorescent member 10 is sliced with a wire or the like so as to have a thickness slightly greater than the desired thickness. The slicing may be performed a plurality of times in order to produce a plurality of fluorescent members 10 with such a thickness. Furthermore, the fluorescent member 10 may be processed to the desired thickness by polishing and grinding.

Then, the reflective film 20 and the diffusion preventive layer 30 are formed on the lower surface of the fluorescent member 10 by a sputtering method or the like. Subsequently, the fluorescent member 10 is cut and singulated by a blade or the like so as to have a desired shape.

Then, the bonding member 40 is placed between the lower surface of the fluorescent member 10 and the upper surface of the base 50 to fix the fluorescent member 10 and the base 50 together. At this time, a AuSn foil is used as the bonding member 40 to perform thermocompression bonding. Thus, pores are less likely to be formed in the bonding member 40, as compared with when using a AuSn solder. Thus, heat generated in the fluorescent member 10 can be easily dissipated.

Then, the upper surface of the fluorescent member 10 is cleaned in order to remove dust adhered when singulating the fluorescent member 10. Before the cleaning, the chromaticity of the light from the fluorescent member 10 is preferably measured by irradiating the upper surface of the fluorescent member 10 with excitation light. For example, acid washing with a phosphoric acid or the like is performed when the fluorescent particles 11 are made of a YAG-based phosphor and the chromaticity obtained by the measurement is closer to yellow than a desired chromaticity. This makes it easier to scrape the fluorescent particles 11 off the surface of the fluorescent member 10. Thus, the chromaticity of the light from the fluorescent member 10 can be matched to the desired chromaticity by shifting the chromaticity of the fluorescent member 10 closer to the color of the excitation light. When the chromaticity obtained by the measurement has already been within the predetermined chromaticity range, the upper surface of the fluorescent member 10 is cleaned by ultrasonic cleaning.

(Light Source 200)

The light source 200 includes, for example, a light emitting diode element or a semiconductor laser element. In particular, the light source 200 preferably includes a semiconductor laser element. This is because the light from the semiconductor laser element is a highly directional light, and thus remarkably exhibits the effect of enhancing the luminance of the fluorescent member 10. Because the semiconductor laser element has a higher output than the light emitting diode element and makes the fluorescent member 10 easily generate heat, the semiconductor laser element is suitable for use in a reflection type optical component 100, which can dissipate heat relatively easier, as shown in FIG. 1. The light source 200 may include a plurality of semiconductor laser elements. The light emitting device 1000 may include a plurality of light sources 200.

The semiconductor laser element or light emitting diode element is preferably one that emits excitation light in a visible region. For example, the semiconductor laser element or light emitting diode element suitable for use is one that contains a nitride semiconductor and has an emission peak wavelength in a range from 430 nm to 480 nm. Here, as shown in FIG. 1, the semiconductor laser element is disposed such that the excitation light from the semiconductor laser element is obliquely incident on the light extraction surface of the fluorescent member 10. When the excitation light is obliquely incident with respect to the fluorescent member 10, the excitation light tends to escape in the regular reflection direction, and thereby the light extracted from above the fluorescent member 10 tends to become light having more fluorescent color. However, according to the optical component 100 of the present embodiment, the excitation light can be reflected and extracted by the pores 13, thus making it possible to increase the intensity of the color of the excitation light, extracted from above the fluorescent member 10.

(Mirror 300)

The mirror 300 reflects the excitation light toward the fluorescent member 10. For example, Micro Electro-Mechanical Systems (MEMS) can be used as the mirror 300. Consequently, the fluorescent member 10 can be irradiated with the excitation light by being scanned with the light beam.

(Lens 400)

The light from the fluorescent member 10 is emitted to the outside through the lens 400. Quartz glass can be used as the material of the lens 400. If the light from the fluorescent member 10 spreads excessively, the amount of light incident on the lens 400 would be reduced. However, as the fluorescent member 10 of the present embodiment has enhanced luminance, the light from the fluorescent member 10 can easily enter the lens 400.

Second Embodiment

Figure 10:
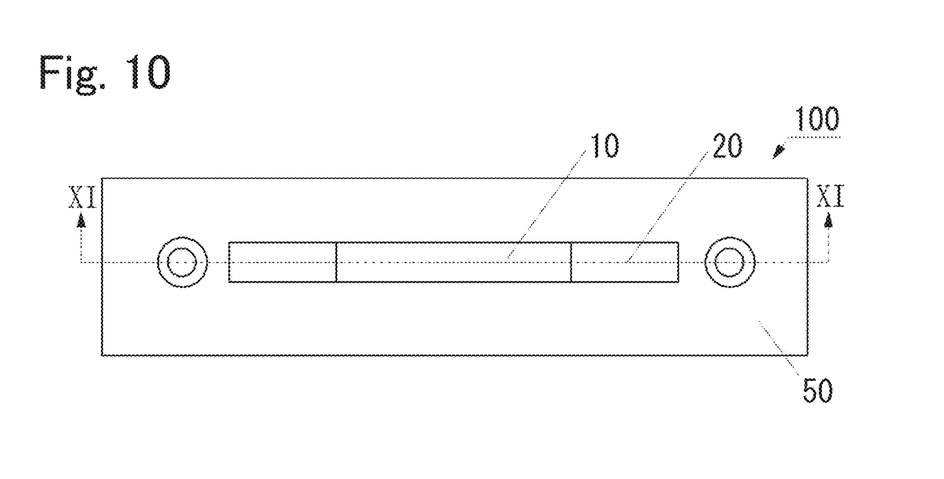
FIG. 10 is a top view of an optical component according to a second embodiment.
Figure 11:
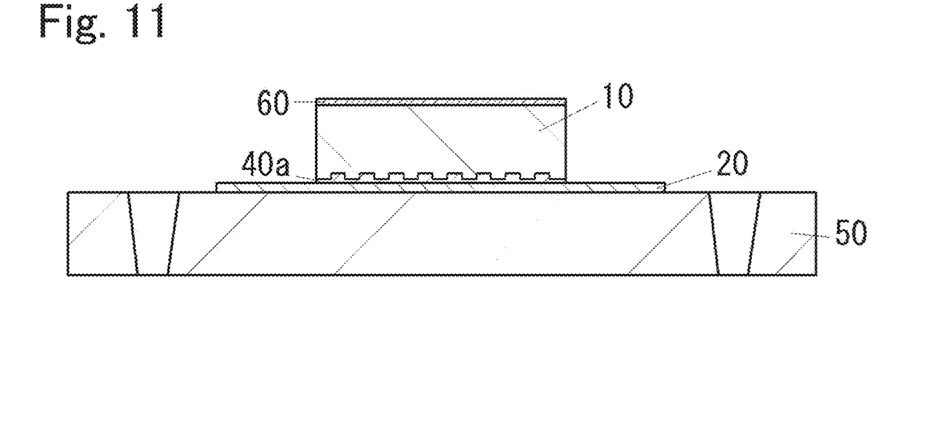
FIG. 11 is a cross-sectional view taken along the line XI-XI in FIG. 10.

As shown in FIGS. 10 and 11, a second embodiment differs from the first embodiment in that the reflective film 20 is provided not on the lower surface of the fluorescent member 10, but on the upper surface of the base 50. Further, the second embodiment differs from the first embodiment also in that the lower surface of the fluorescent member 10 has at least one concave portion, and that the fluorescent member 10 and the base 50 are connected by a transparent bonding member 40a. The configuration of the present embodiment other than the above-mentioned components is the same as that of the first embodiment.

If the reflective film 20 is directly deposited on the lower surface of the fluorescent member 10 as with the first embodiment, the metal contained in the reflective film 20 may migrate into the fluorescent member 10. In this case, part of the metal penetrates into the inside of the fluorescent member 10, resulting in a decrease in the amount of light extracted from the fluorescent member 10. This is considered to be because the metal having penetrated into the fluorescent member 10 changes the color of the fluorescent particles 11 and/or the inorganic binder 12. In addition, this is also considered because the metal itself having penetrated into the fluorescent member 10 absorbs light. As shown in FIG. 11, in the optical component 100 according to the second embodiment, the reflective film 20 is provided not on the lower surface of the fluorescent member 10, but on the upper surface of the base 50, and the fluorescent member 10 and the base 50 are connected by the transparent bonding member 40a. Thus, the transparent bonding member 40a is disposed on the lower surface of the fluorescent member 10, which can prevent the metal contained in the reflective film 20 which is disposed below the transparent bonding member 40a, from migrating into the fluorescent member 10. Consequently, a decrease in the amount of light extracted from the fluorescent member 10 can be suppressed.

Furthermore, in the second embodiment, the lower surface of the fluorescent member 10 has at least one concave portion. Because the fluorescent member 10 has a plurality of pores 13, when the lower surface of the fluorescent member 10 is processed by one or more of slicing, polishing, and grinding so as to have a predetermined thickness, a partial region of one pore 13 may be located in the vicinity of the lower surface of the fluorescent member 10. In such a case, at least one concave portion is formed on the lower surface of the fluorescent member 10 having the plurality of pores 13.

In a case where the lower surface of the fluorescent member 10 has the concave portion, when the reflective film 20 is directly deposited on the lower surface of the fluorescent member 10, the metal contained in the reflective film 20 is more likely to migrate, as compared with a case where the lower surface of the fluorescent member 10 does not have any concave portion. Thus, part of the metal penetrates into the inside of the fluorescent member 10, resulting in a decrease in the amount of light extracted from above the fluorescent member 10. For this reason, in the second embodiment, the fluorescent member 10 and the base 50 are connected by the transparent bonding member 40a such that the reflective film 20 is provided not on the lower surface of the fluorescent member 10 but on the upper surface of the base 50, and that at least one concave portion on the lower surface of the fluorescent member 10 is filled with the transparent bonding member 40a. In this way, the metal contained in the reflective film 20 which is disposed below the transparent bonding member 40a can be prevented from migrating into the fluorescent member 10. Consequently, a decrease in the amount of light extracted from above the fluorescent member 10 can be suppressed.

The transparent bonding member 40a can be formed using a transparent resin (silicone resin, epoxy resin), glass, ceramic, or the like. Among these, a silicone resin is preferably used. This makes it possible to easily fill the concave portion with the transparent bonding member 40a.

The silicone resin is preferable because of its relatively high heat resistance and light transmittance among resins. It is noted that, although in the present embodiment, the concave portion is filled with the transparent bonding member 40a, alternatively, another transparent member may be separately provided to fill the concave portion therewith.

The reflective film 20 provided on the upper surface of the base 50 can be formed using the same material as the reflective film 20, which can be provided on the lower surface of the fluorescent member 10 in the first embodiment. It is noted that, when the base 50 has light-reflecting property, the fluorescent member 10 and the base 50 may be connected by the transparent bonding member 40a without providing the reflective film 20 on the upper surface of the base 50. Here, the expression "has light-reflecting property" means that the base 50 reflects 80% or more of the light that has been wavelength-converted by the fluorescent member 10. Examples of the material of the reflective film 20 having such a light-reflecting property include Ag, Al, and Au.

The width or diameter of at least one concave portion in the lower surface of the fluorescent member 10 is substantially the same as the particle size of the fluorescent particle 11.

Figure 12:
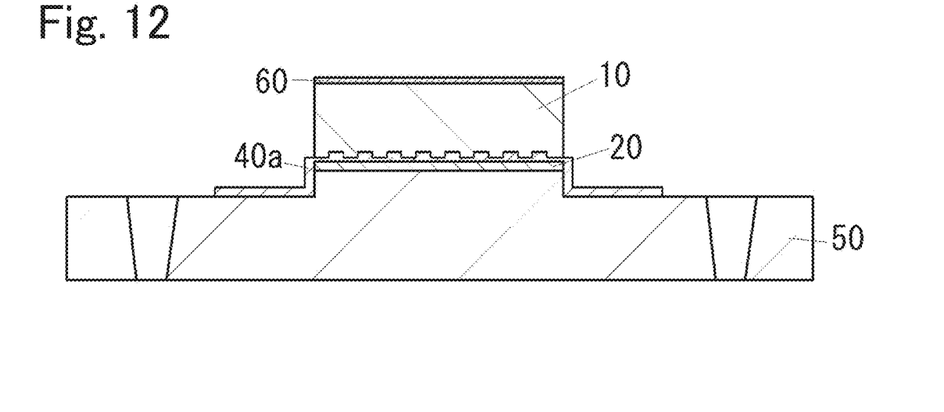
FIG. 12 is a cross-sectional view of a modified example of the optical component according to the second embodiment.

When the transparent bonding member 40a is disposed on the lower surface of the fluorescent member 10, a part of the transparent bonding member 40a may climb up the side surface of the fluorescent member 10 to come around to the upper surface of the fluorescent member 10. In this case, the luminous efficiency of the fluorescent member 10 is reduced. Further, the reliability of the fluorescent member 10 is also degraded. Alternatively, as shown in FIG. 12, by shaping a part of the upper surface of the base into a convex, the reflective film 20, the transparent bonding member 40a, and the fluorescent member 10 can be disposed in this order from the bottom thereof on an upper surface of the convex portion of the base. Thus, the transparent bonding member 40a is more likely to advance to the side surfaces of the convex portion of the base 50 rather than the side surfaces of the fluorescent member 10 due to the influence of the gravity, thereby making it possible to prevent the transparent bonding member 40a from coming around to the upper surface of the fluorescent member 10.

Examples

An optical component was fabricated in the following manufacturing method. First, a mixture of 50% by mass of the fluorescent particles 11, each having a particle size of 5 μm and made of the YAG phosphor, and 50% by mass of the ceramic particles, each having a particle size of 0.5 μm and made of $Al_2O_3$, were prepared. Then, the mixture was heated by the SPS method at 1310° C. for ten minutes to sinter the ceramic particles. The sintered density of the resulting fluorescent member 10 was 93.7%. The resulting fluorescent member 10 was then sliced with a commercially available wire saw. Then, the sliced fluorescent member 10 had its upper surface polished and ground from the upper surface side until its thickness reaches 100 μm.

Then, the reflective film 20 of Al (1 μm in thickness), and the diffusion preventive layer 30 composed of a first layer 31 of Ti (0.2 μm in thickness), a second layer 32 of Pt (0.2 μm in thickness), and a third layer 33 of Au (0.5 μm in thickness) were formed on the lower surface of the fluorescent member 10 in this order from the side close to the lower surface of the fluorescent member 10 by the sputtering method. Subsequently, the fluorescent member was singulated by a blade into pieces, each having a longitudinal length of 12 mm and a lateral length of 3 mm as viewed from the upper surface side.

Then, the base 50 was prepared which was made of Cu as a main component and having its surface plated with Ni of 2 μm in thickness and Au of 100 nm in thickness. The base 50 has a longitudinal length of 30 mm and a lateral length of 12 mm as viewed from the upper surface, and has a thickness of 1.5 mm. First, the base 50 was heated to 250° C., and then a AuSn foil (Au 22%, Sn 78%) was disposed between the upper surface of the base 50 and the lower surface of the fluorescent member 10. Then, the AuSn foil was heated to 280° C. under a load while being melted. After reaching 280° C., the base 50 with the AuSn foil was cooled to 250° C. to complete bonding therebetween. In this way, the base 50 and the fluorescent member 10 were connected by thermocompression bonding.

Then, the fluorescent member 10 was irradiated with laser light having an emission peak wavelength of 450 nm, and subsequently the chromaticity of the light extracted upward from the fluorescent member 10 was measured. Finally, the surface of the fluorescent member 10 was etched with a phosphoric acid solution heated to 130° C. to thereby obtain a desired chromaticity.

Comparative Example

The Comparative Example was substantially the same as the Example described above, except for sintering at 1,450° C. for 15 minutes. The sintered density of a resulting fluorescent member was 99.5%.

Figure 6:
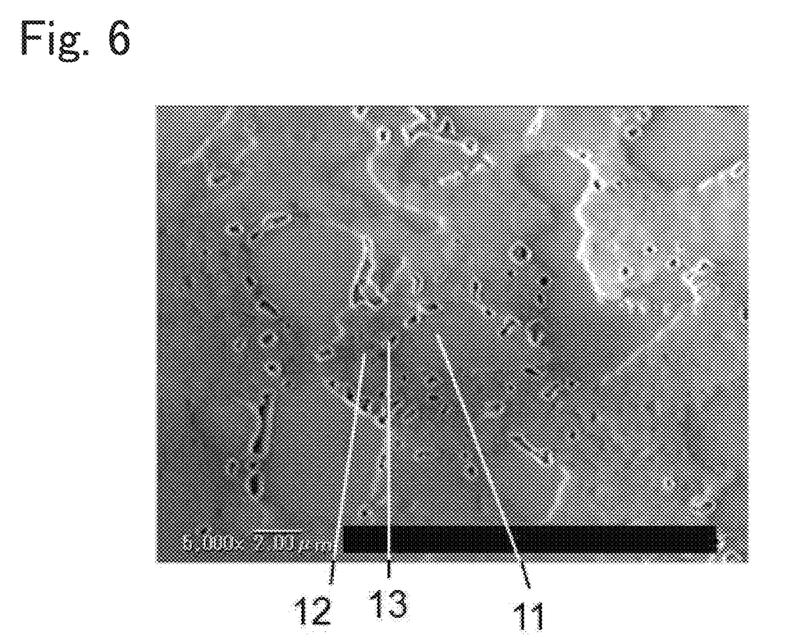
FIG. 6 is a scanning electron microscope (SEM) image of a fluorescent member according to an example.
Figure 7:
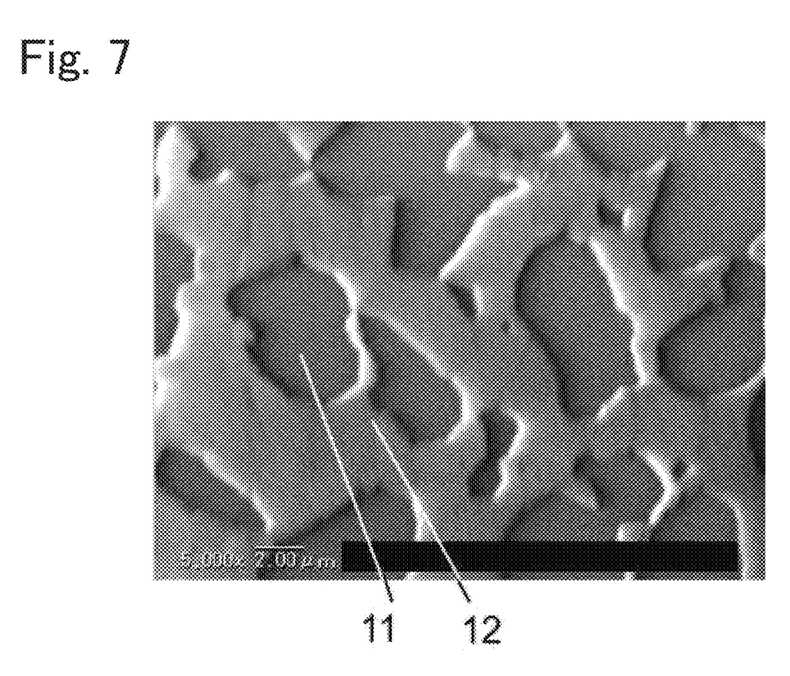
FIG. 7 is an SEM image of a fluorescent member according to a comparative example.

FIG. 6 shows an image of the cross section X of the fluorescent member 10 according to Example, observed with the SEM, whereas FIG. 7 shows an image of the cross section of a fluorescent member according to Comparative Example, observed with the SEM. As can be seen from FIGS. 6 and 7, it was confirmed that in the fluorescent member 10 according to Example, a plurality of pores 13 are localized in the vicinity of the fluorescent particles 11, whereas in the fluorescent member according to Comparative Example, there is no pore. The fluorescent member 10 according to Example was not damaged when being connected with the base 50 by the thermocompression bonding, like the fluorescent member according to Comparative Example having high sintered density. As a result, it could be confirmed that the adequate strength of the fluorescent member 10 was secured.

Figure 8:
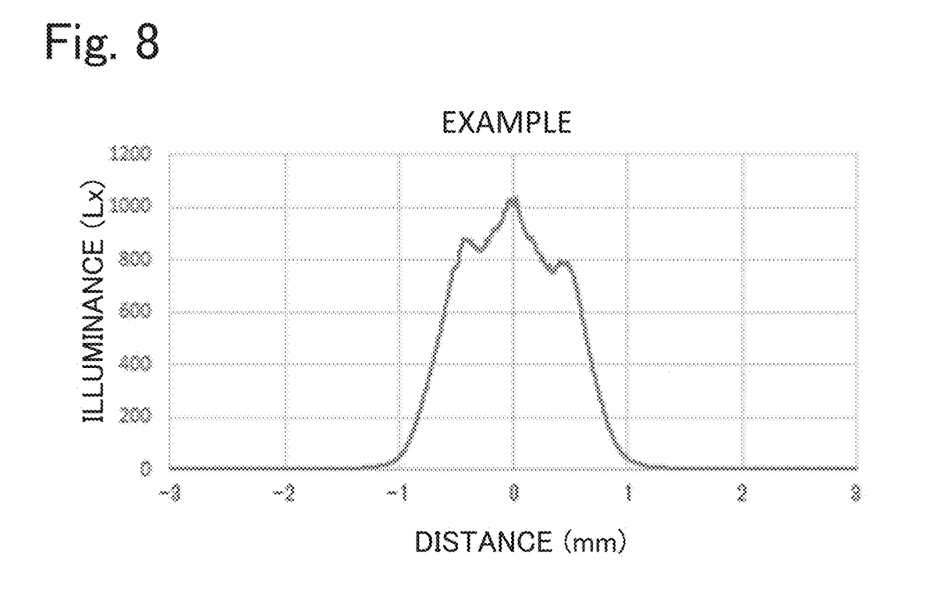
FIG. 8 is data obtained by measuring the illuminance of the fluorescent member according to the example.
Figure 9:
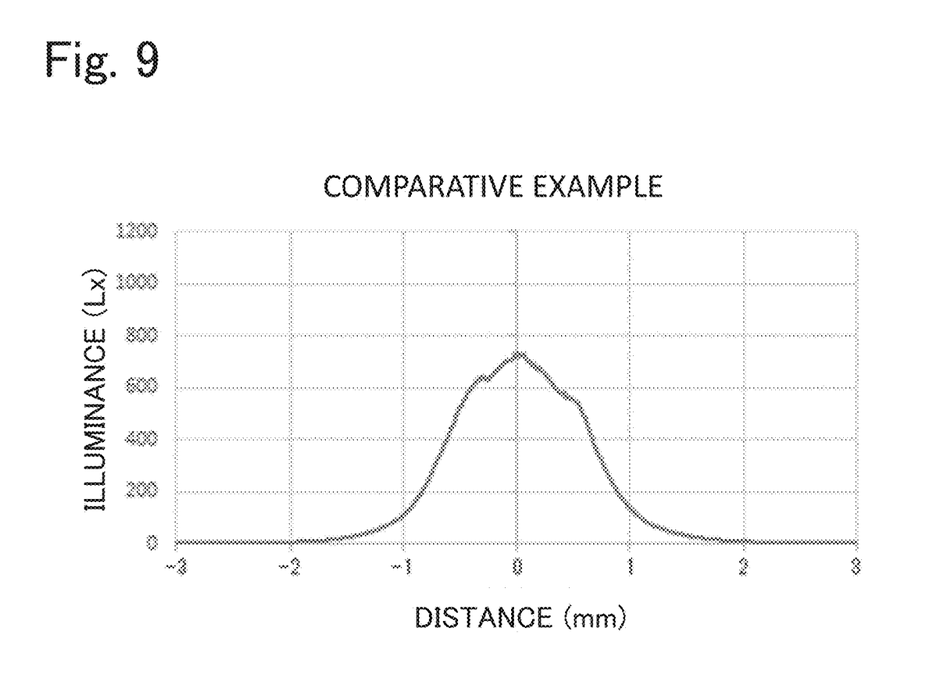
FIG. 9 is data obtained by measuring the illuminance of the fluorescent member according to the comparative example.

FIG. 8 shows data obtained by measuring the illuminance of the fluorescent member 10 according to Example, and FIG. 9 shows data obtained by measuring the illuminance of the fluorescent member according to Comparative Example. Here, the upper surface of the fluorescent member was irradiated from the oblique direction thereof with laser light having an emission peak wavelength of 445 nm along the longitudinal direction of the fluorescent member in the top view (irradiated from the obliquely upper left side thereof in FIG. 3), followed by measuring the illuminance on a line laterally crossing a portion of the fluorescent member 10 that emitted light most brightly in the top view. Specifically, the light extracted from above the fluorescent member was measured by a ProMetric luminance meter, manufactured by Radiant Vision Systems, LLC. As shown in FIGS. 8 and 9, the fluorescent member according to Comparative Example emitted light to illuminate even an area outside the range of ±1 mm from a position of an illuminance peak, at a certain illuminance or higher. In contrast, the fluorescent member 10 according to Example emitted light to illuminate only an area within the range of ±1 mm from a position of an illuminance peak. Through this, it was confirmed that the fluorescent member 10 according to Example could suppress the unnecessary propagation of light through the fluorescent member 10. When compared between Example and Comparative Example regarding the range of ±1 mm from the position of the illuminance peak, the illuminance of the fluorescent member 10 according to Example was higher than that of the fluorescent member according to Comparative Example. Through this, it was confirmed that the fluorescent member 10 according to Example had higher luminance than the fluorescent member according to Comparative Example.

The fluorescent member described in the embodiments can be used for projectors, illumination lamps, vehicular lamps, and the like.

What is claimed is:

1. A fluorescent member comprising:
   a plurality of fluorescent particles;
   an inorganic binder; and
   a plurality of pores;
   wherein an upper surface of the fluorescent member is a light extraction surface of the fluorescent member, and
   wherein the plurality of pores are localized in a vicinity of at least one of the plurality of fluorescent particles in a cross section that is parallel to the upper surface of the fluorescent member and extends through the fluorescent particles and the pores.

2. The fluorescent member according to claim 1, wherein some of the plurality of pores are provided along a periphery of said at least one of the fluorescent particles in the cross section.

3. The fluorescent member according to claim 1, wherein an area of each of the plurality of pores is smaller than an area of each of the plurality of fluorescent particles in the cross section.

4. The fluorescent member according to claim 1, wherein:
   a refractive index of each of the plurality of pores is lower than a refractive index of the inorganic binder,
   the refractive index of the inorganic binder is lower than the refractive index of each of the plurality of fluorescent particles, and
   some of the plurality of pores are in direct contact with the fluorescent particles.

5. The fluorescent member according to claim 1, wherein:
   a content of the fluorescent particles in the fluorescent member is greater than or equal to 40% by mass and less than or equal to 70% by mass, and
   an incident surface of the fluorescent member, on which excitation light for exciting the fluorescent particles is incident, coincides with the upper surface of the fluorescent member.

6. The fluorescent member according to claim 1, wherein the particle size of the fluorescent particle is greater than or equal to 1 μm and less than or equal to 20 μm.

7. The fluorescent member according to claim 1, wherein a sintered density of the fluorescent member is greater than or equal to 90% and less than or equal to 98%.

8. The fluorescent member according to claim 1, wherein an area of each of the plurality of pores is greater than or equal to 0.01 μm$^2$ and less than or equal to 2 μm$^2$.

9. The fluorescent member according to claim 1,
wherein the plurality of pores are provided on ⅓ or more of an entire periphery of said at least one of the fluorescent particles.

10. An optical component comprising:
the fluorescent member according to claim 1, the fluorescent member having a lower surface opposite to the upper surface; and
a base connected to the lower surface of the fluorescent member, a thermal conductivity of the base being higher than a thermal conductivity of the fluorescent member.

11. The optical component according to claim 10, wherein the base comprises at least one of a metal or a light-diffusing ceramic.

12. The optical component according to claim 10, further comprising a reflective film located on the lower surface of the fluorescent member.

13. The optical component according to claim 12, further comprising a diffusion preventive layer located on the lower surface of the reflective film.

14. The optical component according to claim 10, wherein:
an upper surface of the base has a light-reflecting property, and
the upper surface of the base and the lower surface of the fluorescent member are connected by a transparent bonding member.

15. The optical component according to claim 14, further comprising a reflective film located on the upper surface of the base.

16. The optical component according to claim 14, wherein the lower surface of the fluorescent member has at least one concave portion filled with the transparent bonding member.

17. The optical component according to claim 14, wherein:
a part of the upper surface of the base has a convex portion, and
the fluorescent member is connected to the convex portion.

18. The optical component according to claim 17, further comprising a reflective film and a transparent bonding member located on the convex portion, in this order from the base.

19. A light emitting device comprising:
the optical component according to claim 10; and
a semiconductor laser element configured to irradiate an excitation light in a visible region on the fluorescent member, the semiconductor laser element disposed such that the excitation light from the semiconductor laser element is obliquely incident on the upper surface of the fluorescent member.

20. The light emitting device according to claim 19, further comprising a mirror configured to reflect the excitation light from the semiconductor laser element toward the upper surface of the fluorescent member.

* * * * *